US012457788B2

(12) United States Patent
Kim

(10) Patent No.: US 12,457,788 B2
(45) Date of Patent: Oct. 28, 2025

(54) SEMICONDUCTOR DEVICE AND METHOD FOR MANUFACTURING THE SAME

(71) Applicant: SK hynix Inc., Icheon-si (KR)

(72) Inventor: Jae Ho Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 367 days.

(21) Appl. No.: 17/980,988

(22) Filed: Nov. 4, 2022

(65) Prior Publication Data

US 2023/0411465 A1  Dec. 21, 2023

(30) Foreign Application Priority Data

May 24, 2022  (KR) .................. 10-2022-0063481

(51) Int. Cl.
*H10D 64/23* (2025.01)
*H01L 23/532* (2006.01)
*H10D 64/01* (2025.01)
*H10D 64/62* (2025.01)

(52) U.S. Cl.
CPC ..... *H10D 64/251* (2025.01); *H01L 23/53257* (2013.01); *H10D 64/01* (2025.01); *H10D 64/62* (2025.01)

(58) Field of Classification Search
CPC .... H10D 64/251; H10D 64/62; H01L 23/481; H01L 23/5226; H01L 21/76895; H10B 43/40; H10B 43/50; H10B 41/50; H10B 41/40
See application file for complete search history.

(56) References Cited

U.S. PATENT DOCUMENTS

2020/0303300 A1*  9/2020  Kato ................... H01L 23/5226

FOREIGN PATENT DOCUMENTS

KR  1020210121335 A  10/2021
KR  1020210129847 A  10/2021

* cited by examiner

*Primary Examiner* — Wasiul Haider
(74) *Attorney, Agent, or Firm* — WILLIAM PARK AND ASSOCIATES LTD.

(57) ABSTRACT

A semiconductor device includes a first contact plug penetrating a source structure, the first contact plug having a first portion having a first width and a second portion having a second width that is larger than the first width, a stack formed on the source structure and the first contact plug, a second contact plug penetrating the stack, the second contact plug connected to the first contact plug, a first spacer surrounding the first portion and the second portion of the first contact plug, and a second spacer surrounding the first spacer to surround the second portion of the first contact plug.

14 Claims, 25 Drawing Sheets

SEMICONDUCTOR DEVICE AND METHOD FOR MANUFACTURING THE SAME

CROSS-REFERENCE TO RELATED APPLICATION

This application claims priority under 35 U.S.C. § 119(a) to Korean Patent Application No. 10-2022-0063481 filed on May 24, 2022, in the Korean Intellectual Property Office, which is incorporated herein by reference in its entirety.

BACKGROUND

1. Technical Field

Embodiments of the present disclosure relate to an electronic device and a method for manufacturing the same, and more particularly, to a semiconductor device and a method for manufacturing the same.

2. Related Art

The degree of integration of a semiconductor device is mainly determined by the area that is occupied by a unit memory cell. Recently, as the degree of integration of a semiconductor device having memory cells that are formed as a single layer on a substrate reaches its limit, a three-dimensional semiconductor device having memory cells stacked on a substrate has been suggested. Furthermore, in order to improve the operational reliability of such a semiconductor device, various structures and manufacturing methods are being developed.

SUMMARY

In an embodiment, a semiconductor device may include: a first contact plug penetrating a source structure, the first contact plug having a first portion having a first width and a second portion having a second width that is larger than the first width; a stack formed on the source structure and the first contact plug; a second contact plug penetrating the stack, the second contact plug connected to the first contact plug; a first spacer surrounding the first portion and the second portion of the first contact plug; and a second spacer surrounding the first spacer to surround the second portion of the first contact plug.

In an embodiment, a semiconductor device may include: a first contact plug penetrating a source structure; a stack formed on the source structure and the first contact plug; a second contact plug penetrating the stack, the second contact plug connected to the first contact plug; a first spacer surrounding a sidewall of the first contact plug, the first contact plug including a first portion having a first width and a second portion having a second width that is larger than the first width, wherein a first portion of the first spacer surrounds the first portion of the first contact plug and a second portion of the first spacer surrounds the second portion of the first contact plug; and a second spacer surrounding the second portion of the first spacer.

In an embodiment, a method for manufacturing a semiconductor device may include: forming a sacrificial layer in a source structure; forming a first opening that penetrates the source structure; forming a first spacer in the first opening; forming a first contact plug in the first spacer; forming a stack on the source structure; forming a second opening that penetrates the stack and exposes the sacrificial layer; forming a third opening by removing the sacrificial layer through the second opening; and forming a second spacer in the third opening.

In an embodiment, a method for manufacturing a semiconductor device may include: forming a first insulating spacer that penetrates a source structure to a first depth; forming a second insulating spacer that penetrates the source structure to a second depth that is different from the first depth; forming a first contact plug in the first insulating spacer; forming a stack on the source structure; and forming a second contact plug that penetrates the stack and electrically connected to the first contact plug.

DETAILED DESCRIPTION

Various embodiments are directed to a semiconductor device having a stable structure and improved characteristics and a method for manufacturing the same.

In accordance with the present embodiment, it is possible to provide a semiconductor device having a stable structure and improved reliability.

Hereafter, embodiments in accordance with the technical spirit of the present disclosure will be described with reference to the accompanying drawings.

FIG. 1A to FIG. 1D are diagrams illustrating the structure of a semiconductor device in accordance with an embodiment.

Figure 1A:
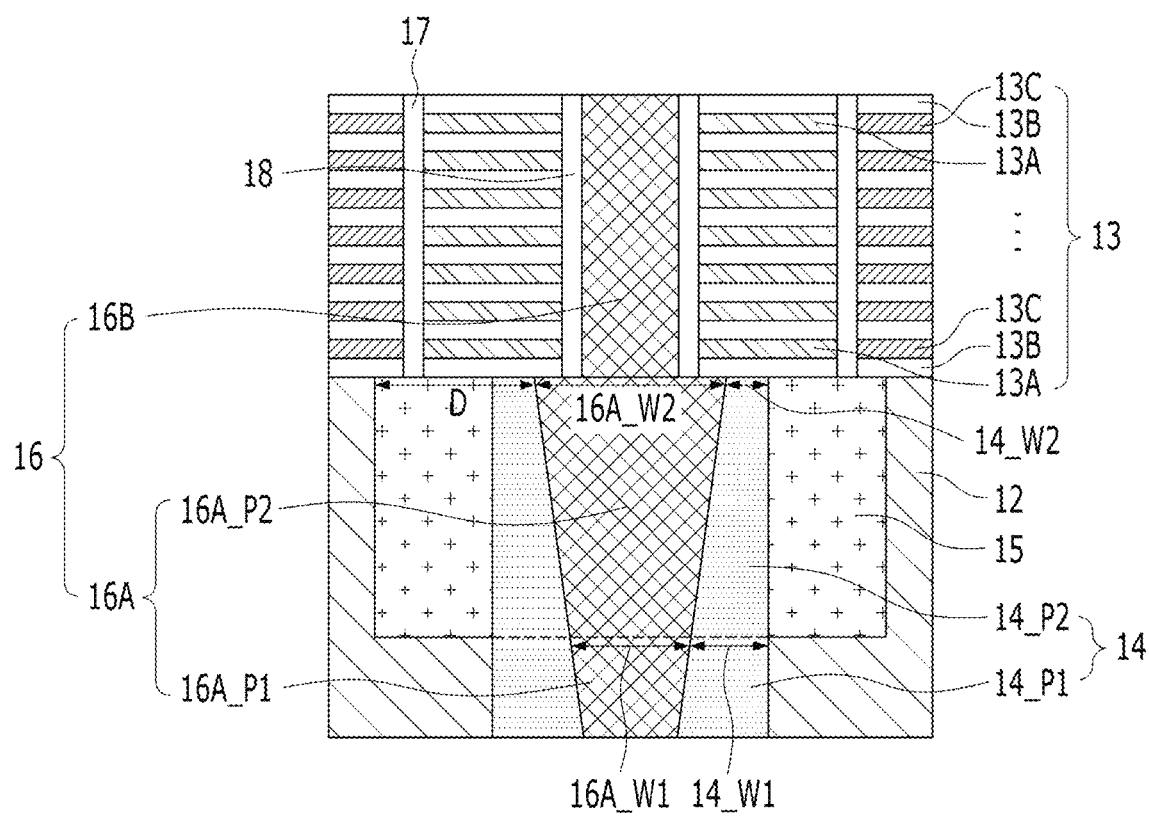
FIG. 1A to FIG. 1D are diagrams illustrating the structure of a semiconductor device in accordance with an embodiment.

Referring to FIG. 1A, the semiconductor device may include a source structure 12, a stack 13, a first spacer 14, a second spacer 15, and a contact plug 16. The semiconductor device may further include a support 17, a third spacer 18, or a combination thereof.

The source structure 12 may have a single-layer or multi-layer structure. The source structure 12 may include a conductive material such as polysilicon or metal.

The stack 13 may be located on the source structure 12. The stack 13 may include a sacrificial layer 13A, an insulating layer 13B, or a conductive layer 13C. For example, the stack 13 may include the conductive layers 13C and the insulating layers 13B that are alternately stacked. The stack 13 may include the sacrificial layers 13A and the insulating layers 13B that are alternately stacked. The conductive layers 13C and the sacrificial layers 13A may be located at levels corresponding to each other. The conductive layer 13C may include a metal material such as tungsten. Furthermore, the conductive layer 13C may be a word line or a select line.

The contact plug 16 may include a first contact plug 16A and a second contact plug 16B. The first contact plug 16A may penetrate the source structure 12. The first contact plug 16A may include a conductive material, such as tungsten or metal.

The first contact plug 16A may include a first portion 16A_P1 and a second portion 16A_P2. The first portion 16A_P1 and the second portion 16A_P2 may have substantially the same width or different widths. The first portion 16A_P1 may have a first width 16A_W1, and the second portion 16A_P2 may have a second width 16A_W2 that is larger than the first width 16A_W1. The "substantially" may indicate that measurement values are equal to each other or fall within a range that takes into account process errors.

The first portion 16A_P1 or the second portion 16A_P2 may have a uniform width or may have different widths according to levels. For example, the first portion 16A_P1 or the second portion 16A_P2 may have a cross-section having a tapered shape that decreases in width toward a lower portion. When the first portion 16A_P1 has different widths according to levels, the first width 16A_W1 may be a maximum width of the first portion 16A_P1. When the second portion 16A_P2 has different widths according to levels, the second width 16A_W2 may be a maximum width of the second portion 16A_P2.

A sidewall of the first contact plug 16A may be surrounded by the first spacer 14. For example, the first spacer 14 may surround the first portion 16A_P1 and the second portion 16A_P2 of the first contact plug 16A. The first spacer 14 may be used to insulate the source structure 12 and the first contact plug 16A from each other and may be an insulating spacer. The first spacer 14 may penetrate the source structure 12.

The first spacer 14 may include a first portion 14_P1 and a second portion 14_P2. The first portion 14_P1 of the first spacer 14 may surround a sidewall of the first portion 16A_P1 of the first contact plug 16A. The second portion 14_P2 of the first spacer 14 may surround a sidewall of the second portion 16A_P2 of the first contact plug 16A.

The first portion 14_P1 and the second portion 14_P2 of the first spacer 14 may have substantially the same thickness or different thicknesses. The first portion 14_P1 may have a first width 14_W1, and the second portion 14_P2 may have a second width 14_W2 smaller than the first width 14_W1. The first portion 14_P1 or the second portion 14_P2 may have a uniform width or may have different widths according to levels. When the first portion 14_P1 has different widths according to levels, the first width 14_W1 may be a minimum width of the first portion 14_P1. When the second portion 14_P2 has different widths according to levels, the second width 14_W2 may be a minimum width of the second portion 14_P2.

An outer wall of the first spacer 14 may face the second spacer 15 and may have a vertical profile. An inner wall of the first spacer 14 may face the first contact plug 16A and may include an inclined surface. The first spacer 14 may include an insulating material, such as oxide.

The second spacer 15 may penetrate a part of the source structure 12. For example, the first spacer 14 may penetrate the source structure 12 to a first depth, and the second spacer 15 may penetrate the source structure 12 to a second depth that is different from the first depth. The second spacer 15 may be used to supplement the thickness of the first spacer 14 and may be an insulating spacer. The second spacer 15 may surround a part of a sidewall of the first spacer 14. The second spacer 15 may selectively surround a relatively thin portion of the first spacer 14. For example, the second spacer 15 may surround the second portion 14_P2 of the first spacer 14. However, the present disclosure is not limited thereto, and the second spacer 15 may also surround the entire sidewall of the first spacer 14.

The second spacer 15 may include a material that is substantially equal to or different from that of the first spacer 14. The second spacer 15 may include an insulating material such, as oxide. The second spacer 15 may have a uniform width or may have different widths according to levels. A distance between the first contact plug 16A and the source structure 12 may be sufficiently secured by the second spacer 15 that is located between the first spacer 14 and the source structure 12.

The second contact plug 16B may penetrate the stack 13 and may be connected to the first contact plug 16A. The second contact plug 16B may be located on the first contact plug 16A. The second contact plug 16B may be electrically connected to the first contact plug 16A. The second contact plug 16B may include a material that is substantially equal to or different from that of the first contact plug 16A. The second contact plug 16B may include a conductive material, such as tungsten or metal.

The second contact plug 16B may have a uniform width or may have different widths according to levels. For example, the second contact plug 16B may have a cross-section having a tapered shape that decreases in width toward a lower portion. The second contact plug 16B may have a width that is substantially equal to or different from that of the first contact plug 16A on the contact surface with the first contact plug 16A. For example, the width of the second contact plug 16B on the contact surface may be smaller than that of the first contact plug 16A.

A sidewall of the second contact plug 16B may be surrounded by the third spacer 18. The third spacer 18 may be located between the stack 13 and the second contact plug 16B. The third spacer 18 may include an insulating material, such as oxide. The third spacer 18 may have a uniform width or may have different widths according to levels.

The support 17 may be located on the second spacer 15. The support 17 may penetrate the stack 13 and may be connected to the second spacer 15. The support 17 may include a material substantially equal to or different from that of the second spacer 15. The support 17 may include an insulating material, such as oxide.

Figure 1B:
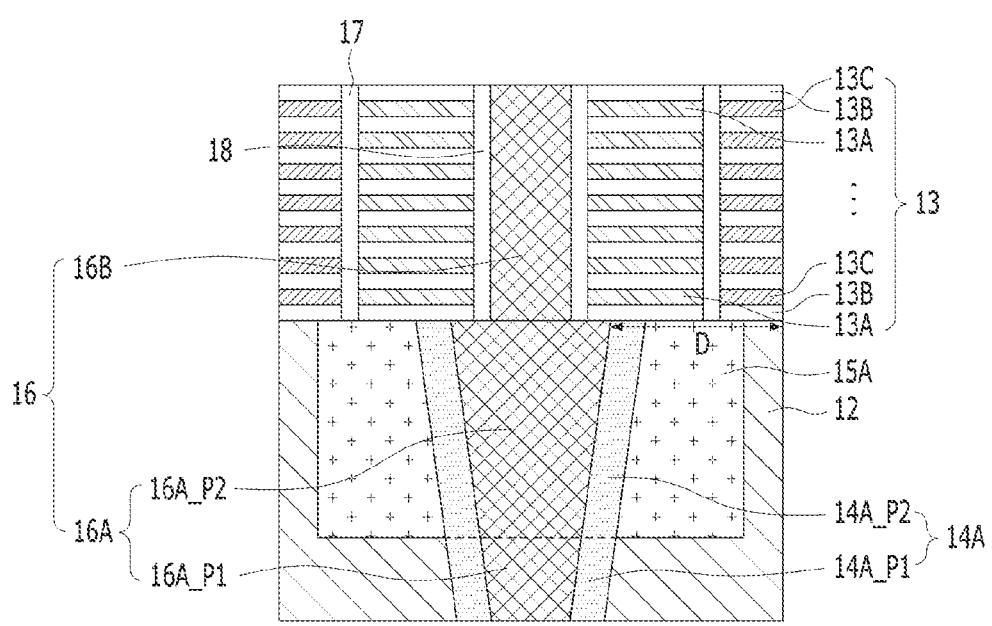

Referring to FIG. 1B, the semiconductor device may include a first spacer 14A and a second spacer 15A. Other structures may be the same as or similar to those of the embodiment described above with reference to FIG. 1A.

The first spacer 14A may include a first portion 14A_P1 and a second portion 14A_P2. The first portion 14A_P1 and the second portion 14A_P2 may have substantially the same thickness. An outer wall of the first spacer 14A may face the second spacer 15A and may include an inclined surface. An inner wall of the first spacer 14A may face the first contact plug 16A and may include an inclined surface.

The second spacer 15A may surround a part of a sidewall of the first spacer 14A. For example, the second spacer 15A may surround the second portion 14A_P2 of the first spacer 14A. However, the present disclosure is not limited thereto, and the second spacer 15A may surround the entire sidewall of the first spacer 14A. The second spacer 15A may include an insulating material, such as oxide.

Figure 1C:
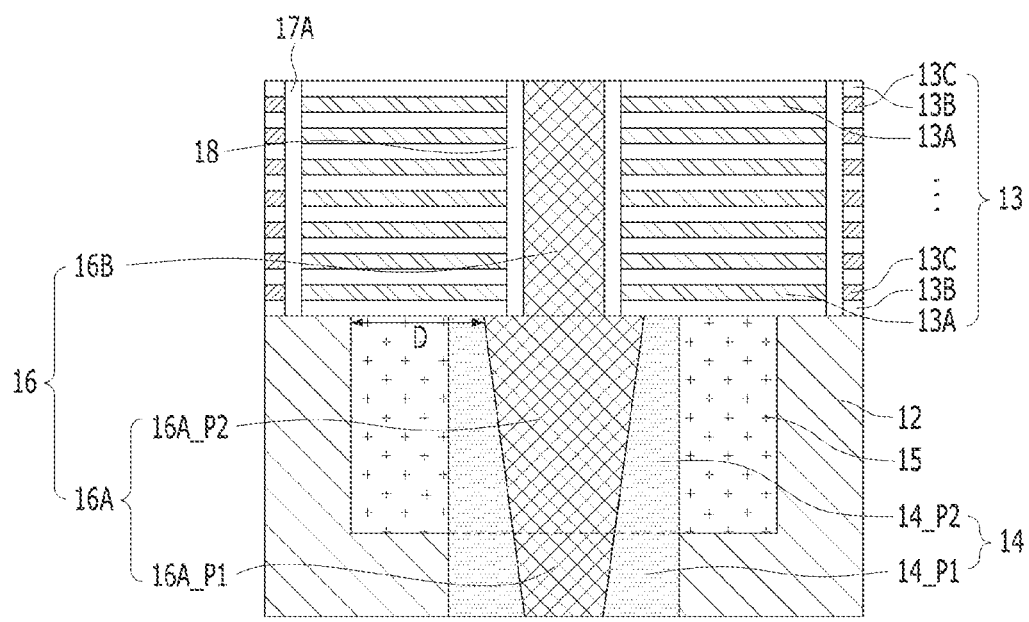

Referring to FIG. 1C, the semiconductor device may include a support 17A. Other structures may be the same as or similar to those of the embodiments described above with reference to FIG. 1A or FIG. 1B.

The support 17A may be located on the source structure 12. The support 17A may penetrate the stack 13. Compared to the support 17 of FIG. 1A, the support 17A may be spaced apart from the second spacer 15. The support 17A may include a material substantially equal to or different from that of the second spacer 15. The support 17A may include an insulating material, such as oxide.

Figure 1D:
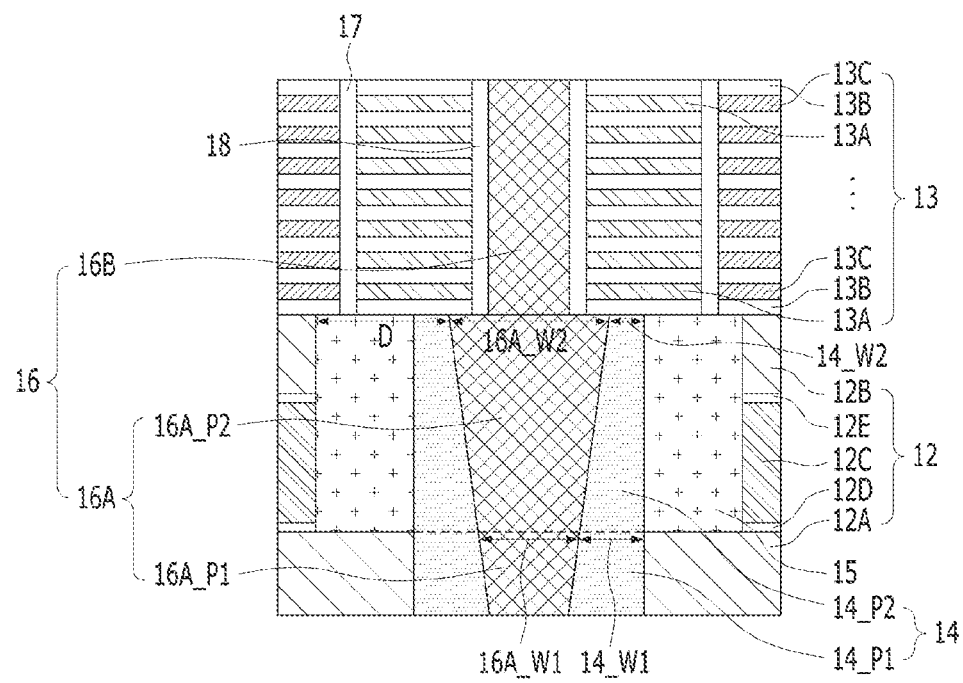

Referring to FIG. 1D, the semiconductor device may include a source structure 12, and the source structure 12 may include a first source layer 12A, a second source layer 12B, a source sacrificial layer 12C, or a combination thereof. Other structures may be the same as or similar to those of the embodiments described above with reference to FIG. 1A, FIG. 1B, or FIG. 1C.

The first source layer 12A may be spaced apart from the stack 13. The second source layer 12B may be adjacent to the stack 13. The source sacrificial layer 12C may be located between the first source layer 12A and the second source layer 12B. The source sacrificial layer 12C may remain without being replaced with a third source layer 12F during the manufacturing process. The first source layer 12A, the second source layer 12B, or the source sacrificial layer 12C may include a conductive material, such as polysilicon or metal.

The source structure 12 may further include a first passivation layer 12D, a second passivation layer 12E, or a combination thereof. The first passivation layer 12D may be located between the first source layer 12A and the source sacrificial layer 12C. The second passivation layer 12E may be located between the second source layer 12B and the source sacrificial layer 12C. The first passivation layer 12D or the second passivation layer 12E may be used to protect the first source layer 12A or the second source layer 12B during the manufacturing process. The first passivation layer 12D or the second passivation layer 12E may have a single-layer or multi-layer structure. Furthermore, the first passivation layer 12D or the second passivation layer 12E may include an insulating material, such as oxide or nitride.

According to the structure as described above, a distance D can be secured between the first contact plug 16A and the source structure 12 by the first spacers 14 and 14A and the second spacers 15 and 15A that surrounds the sidewall of the first contact plug 16A. Accordingly, it is possible to prevent, mitigate, minimize or decrease a bridge from occurring between the first contact plug 16A and the source structure 12.

When the first contact plug 16A has a tapered cross-section, the width of the second portion 16A_P2 may be relatively large, and the widths of the second portions 14_P2 and 14A_P2 may be relatively small. In such a case, a sufficient distance might not be secured between the second portion 16A_P2 and the source structure 12 by the first spacers 14 and 14A, and a bridge may be caused. Accordingly, the thicknesses of the first spacers 14 and 14A may be supplemented by additionally forming the second spacers 15 and 15A in portions in which the thicknesses of the first spacers 14 and 14A are insufficient. The first spacers 14 and 14A may primarily surround the sidewall of the first contact plug 16A, and secondarily, the second spacers 15 and 15A may surround the sidewalls of the first spacers 14 and 14A. In such a case, the distance D between the second portion 16A_P2 and the source structure 12 can be sufficiently secured by the second spacers 15 and 15A, and a bridge can be prevented, mitigated, minimized or decreased.

Furthermore, since the distance between the second portion 16A_P2 and the source structure 12 is sufficiently secured by the second spacers 15 and 15A, an alignment margin between the second contact plug 16B and the first contact plug 16A can be secured. Accordingly, even though the second contact plug 16B is misaligned with the first contact plug 16A, the second contact plug 16B might not be electrically connected to the source structure 12.

Figure 2A:
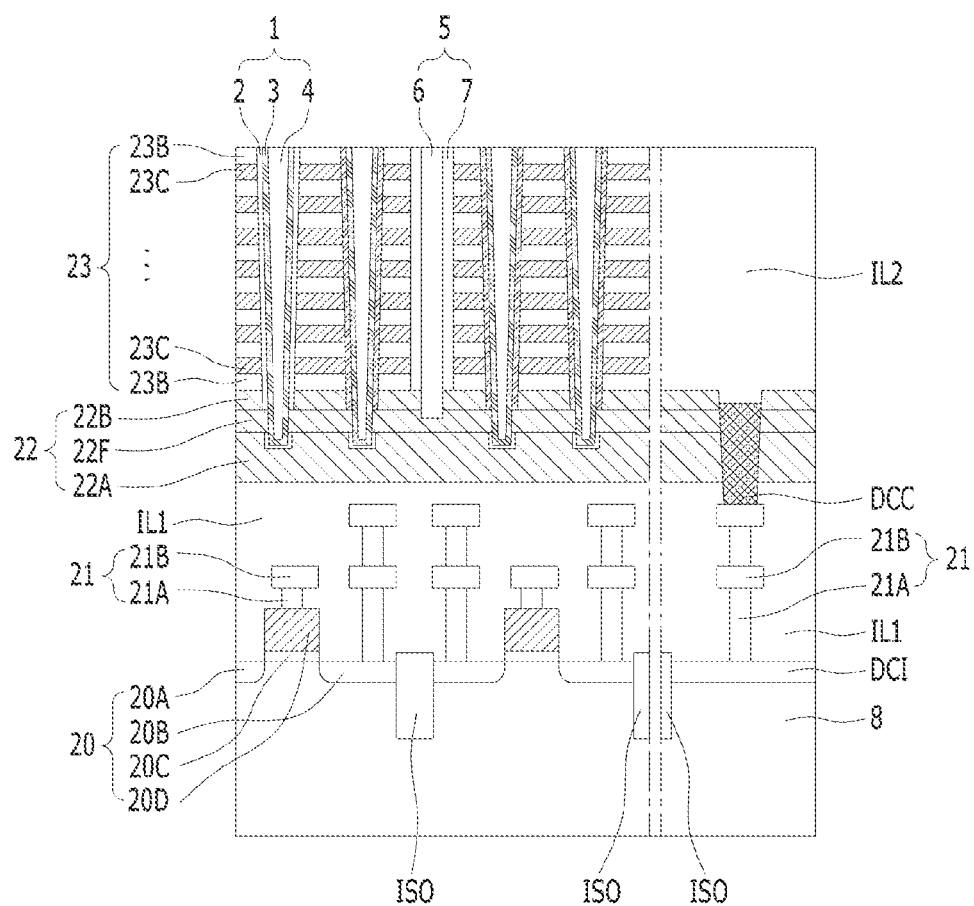
FIG. 2A and FIG. 2B are diagrams illustrating the structure of a semiconductor device in accordance with an embodiment.
Figure 2B:
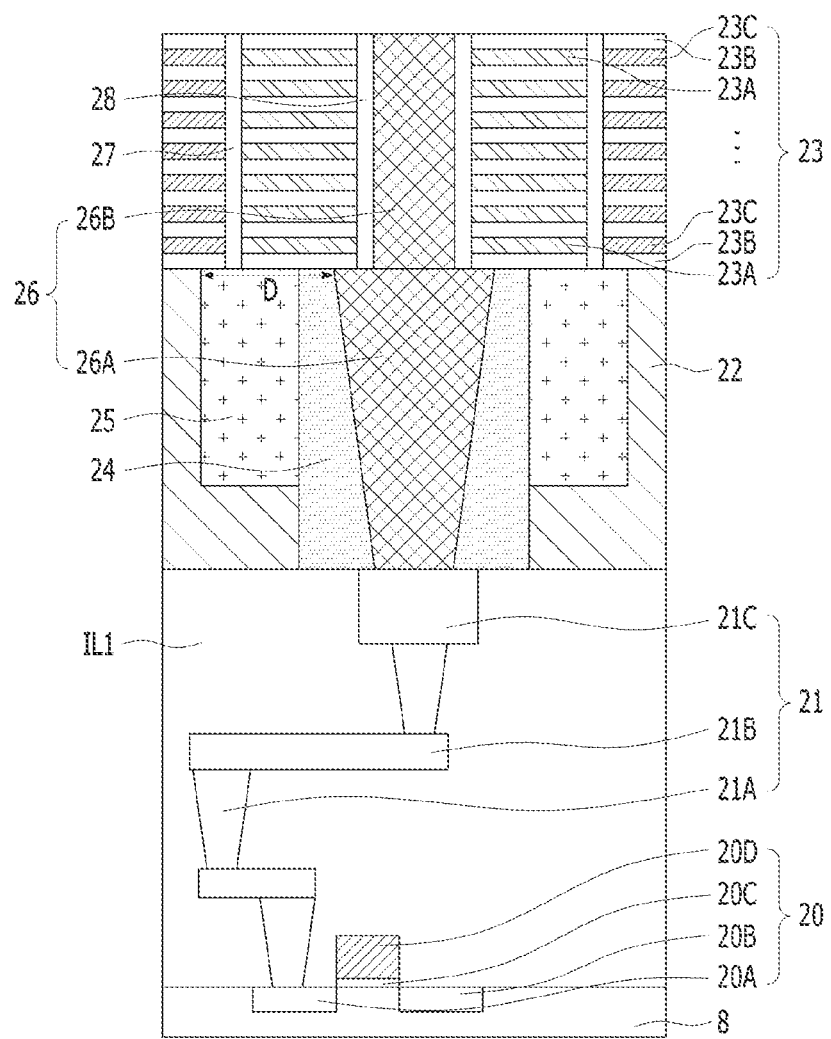

FIG. 2A and FIG. 2B are diagrams illustrating the structure of a semiconductor device in accordance with an embodiment. Hereafter, contents overlapping the above-described contents will be omitted.

Referring to FIG. 2A, the semiconductor device may include a channel structure 1, a source contact structure 5, a source structure 22, and a stack 23. The semiconductor device may further include a substrate 8, a peripheral circuit 20, an interconnection structure 21, a conductive contact plug (DCC), or a combination thereof.

The channel structure 1 may penetrate the stack 23. For example, the channel structure 1 may penetrate insulating layers 23B and conductive layers 23C that are alternately stacked. The channel structure 1 may include a channel layer 3 penetrating the stack 23. The channel structure 1 may further include at least one of a memory layer 2 that surrounds a sidewall of the channel layer 3 or an insulating core 4 in the channel layer 3. The channel layer 3 may include a semiconductor material, such as silicon or germanium. The memory layer 2 may include a blocking layer, a data storage layer, or a tunneling layer, or include a combination thereof. The insulating core 4 may include an insulating material, such as oxide, nitride, or air gap. The channel structure 1 may be connected to the source structure 22 by penetrating the stack 23. For example, the channel layer 3 and the source structure 22 may be directly connected, or the channel layer 3 and the source structure 22 may be connected through an epitaxially grown semiconductor pattern.

The source contact structure 5 may penetrate the stack 23. For example, the source contact structure 5 may penetrate the insulating layers 23B and the conductive layers 23C that are alternately stacked. The source contact structure 5 may include a conductive layer 6 and may further include an insulating spacer 7. The source contact structure 5 may be connected to the source structure 22 by penetrating the stack 23. For example, the conductive layer 6 may be electrically connected to a first source layer 22A by penetrating the stack 23. The conductive layer 6 may be surrounded by an insulating spacer 7. The conductive layer 6 may include polysilicon, metal, or the like. The insulating spacer 7 may include an insulating material, such as oxide, nitride, or air gap.

A third source layer 22F may be located between the first source layer 22A and a second source layer 22B. For example, the third source layer 22F and the source sacrificial layer 22C may be located at substantially the same level. The third source layer 22F may be connected to the channel layer 3 by penetrating the memory layer 2. The third source layer 22F may include polysilicon.

A peripheral circuit may be located on the substrate 8. The substrate 8 may be a semiconductor substrate, such as silicon. An isolation layer ISO may be located in the substrate 8, and an active region may be defined by the isolation layer ISO. The peripheral circuit may include a transistor 20, a capacitor, a resistor, and the like. For example, the transistor 20 may include a first junction 20A, a second junction 20B, a gate insulating layer 20C, or a gate electrode 20D. The gate electrode 20D may be located on the substrate 8. The gate electrode 20D may include a conductive material. The first junction 20A and the second junction 20B may be located in the substrate 8 on both sides of the gate electrode 20D. The first junction 20A or the second junction 20B may include n-type or p-type impurities. The gate insulating layer 20C may be located between the gate electrode 20D and the substrate 8. The gate insulating layer 20C and the isolation layer ISO may each include an insulating material, such as oxide or nitride.

The interconnection structure 21 may include contact plugs 21A, wirings 21B, and the like. A first insulating layer IL1 may be located between the substrate 8 and the source structure 22, and the interconnection structure 21 may be located in the first insulating layer IL1. The contact plug 21A or the wiring 21B may include a conductive material, such as aluminum, copper, or tungsten.

The conductive contact plug DCC may penetrate the source structure 22. The conductive contact plug DCC may be a discharge contact plug for discharging charges that are accumulated in the source structure 22 during the manufacturing process of the semiconductor device. The conductive contact plug DCC may be connected to the substrate 8 through the interconnection structure 21. For example, the substrate 8 may include a discharge impurity region DCI, and the conductive contact plug DCC may be connected to the discharge impurity region DCI through the interconnection structure 21. The conductive contact plug DCC may be located at a level corresponding to the first contact plug 16A, described with reference to FIG. 1A or 1B. A second insulating layer IL2 may be located on the conductive contact plug DCC. The second insulating layer IL2 and the stack 23 may be located at substantially the same level as or different levels.

Referring to FIG. 2B, the semiconductor device may include a source structure 22, a stack 23, a first spacer 24, a second spacer 25, and a contact plug 26. The semiconductor device may further include a substrate 8, a peripheral circuit 20, an interconnection structure 21, a support 27, a third spacer 28, or a combination thereof.

The stack 23 may be located on the source structure 22. The stack 23 may include a sacrificial layer 23A, an insulating layer 23B, or a conductive layer 23C.

The contact plug 26 may include a first contact plug 26A and a second contact plug 26B. The first contact plug 26A may penetrate the source structure 22. The second contact plug 26B may penetrate the stack 23 and may be connected to the first contact plug 26A. The second contact plug 26B may be located on the first contact plug 26A.

The first spacer 24 may penetrate the source structure 22. The first spacer 24 may surround a sidewall of the first contact plug 26A. The second spacer 25 may penetrate a part of the source structure 22. The second spacer 15 may surround a part of a sidewall of the first spacer 14. The distance D between the first contact plug 26A and the source structure 22 may be sufficiently secured by the second spacer 25 that is located between the first spacer 24 and the source structure 22.

The third spacer 28 may surround a sidewall of the second contact plug 26B. The support 27 may be located on the second spacer 25. The support 27 may penetrate the stack 23 and may be connected to the second spacer 25.

The interconnection structure 21 may include a contact plug 21A or a wiring 21B and may further include a connection pad 21C. The interconnection structure 21 may connect the peripheral circuit 20 and the contact plug 26. The connection pad 21C may include a conductive material, such as aluminum, copper, or tungsten.

Figure 3A:
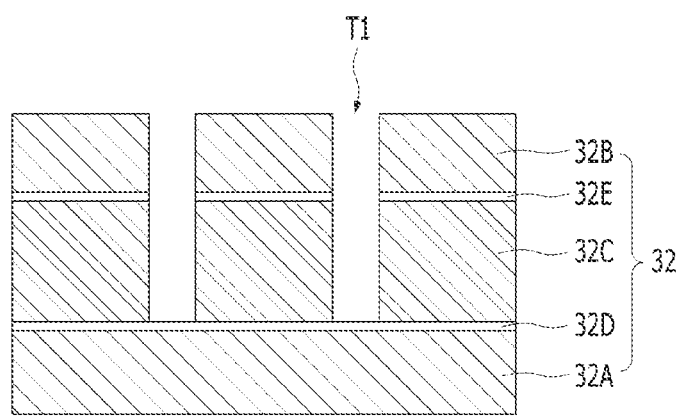
FIG. 3A to FIG. 3N are diagrams illustrating a method for manufacturing a semiconductor device in accordance with an embodiment.
Figure 3B:
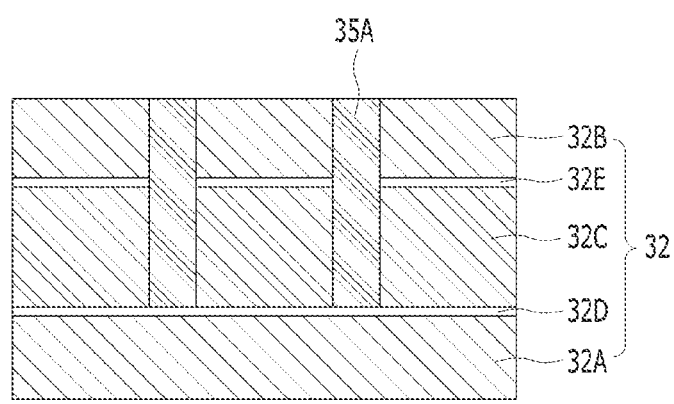
Figure 3C:
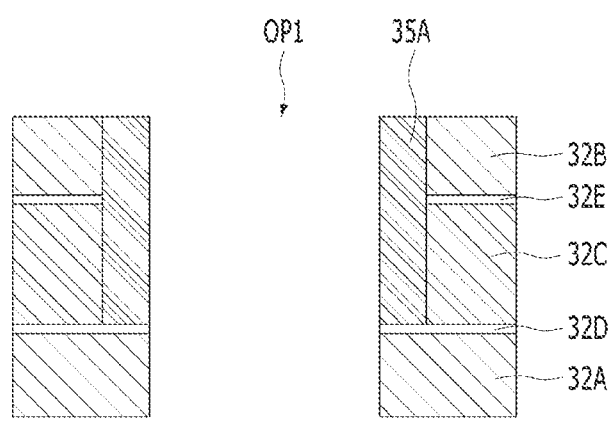
Figure 3D:
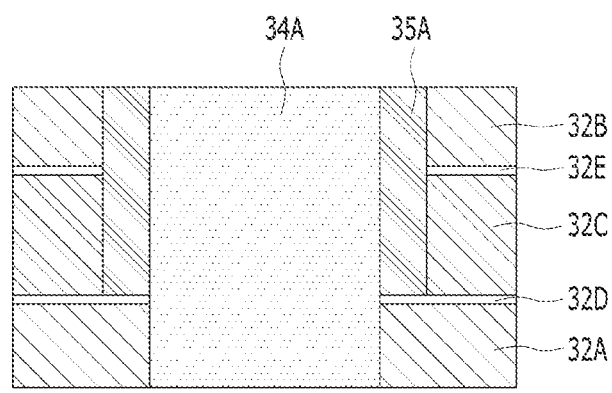
Figure 3E:
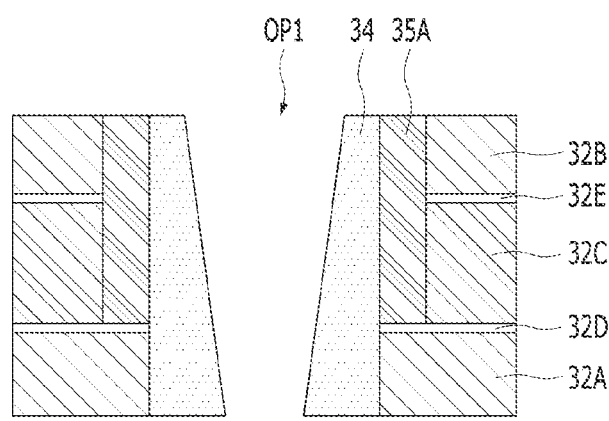
Figure 3F:
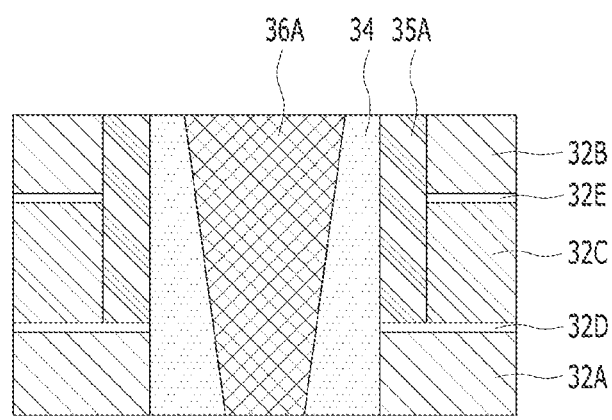
Figure 3G:
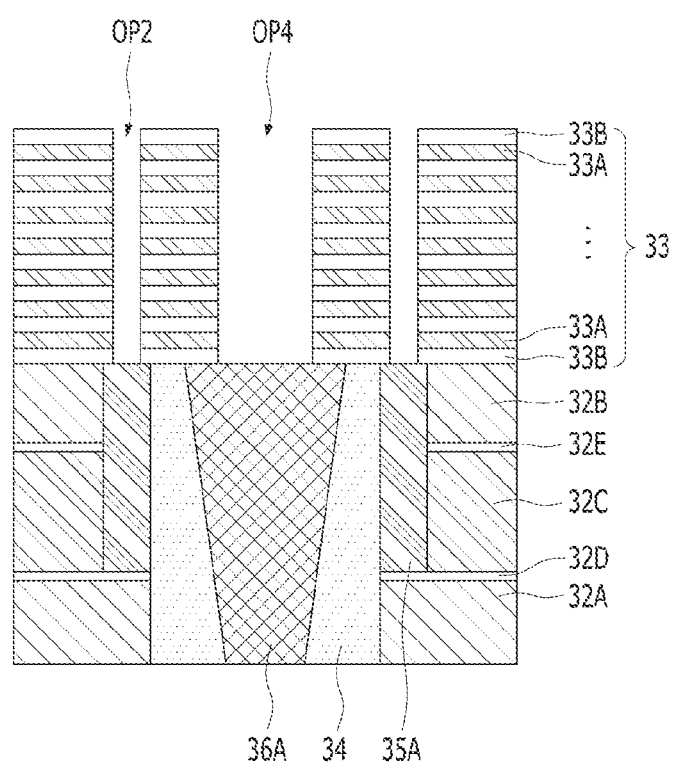
Figure 3H:
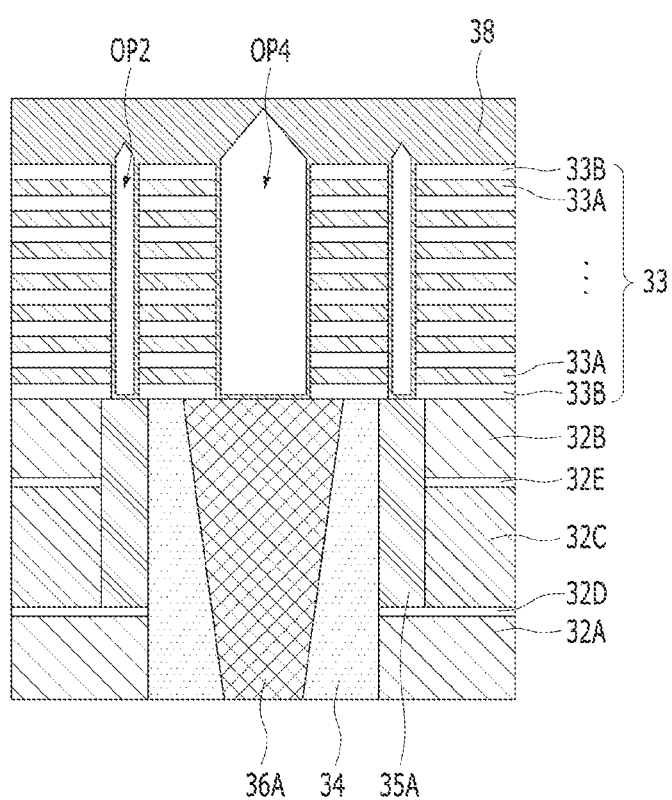
Figure 3I:
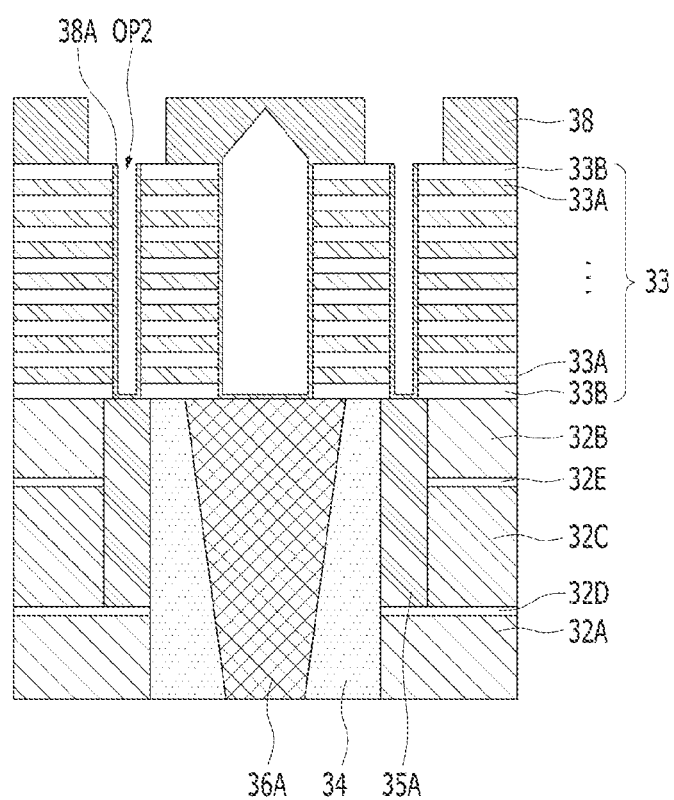
Figure 3J:
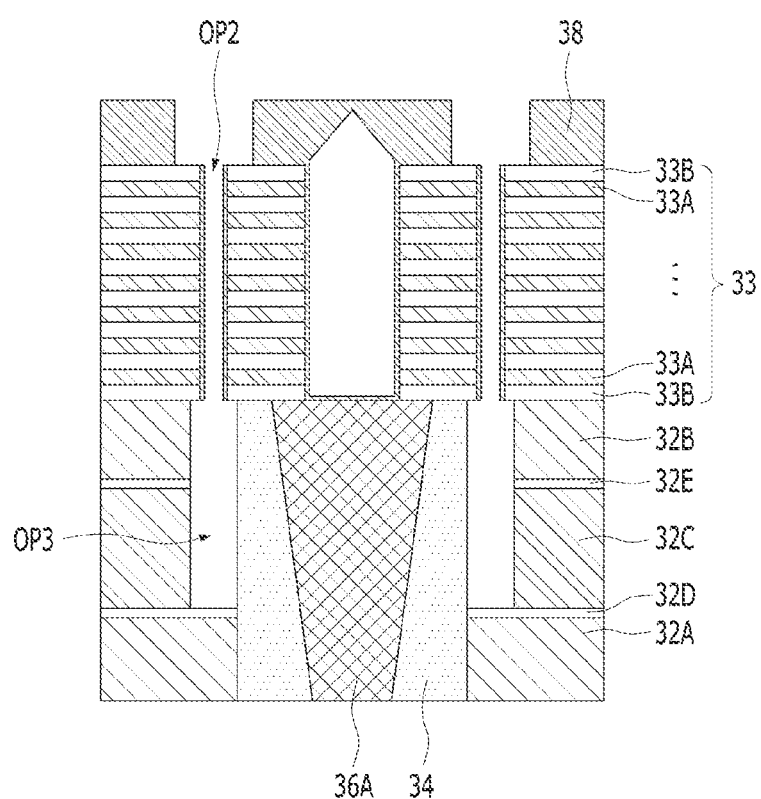
Figure 3K:
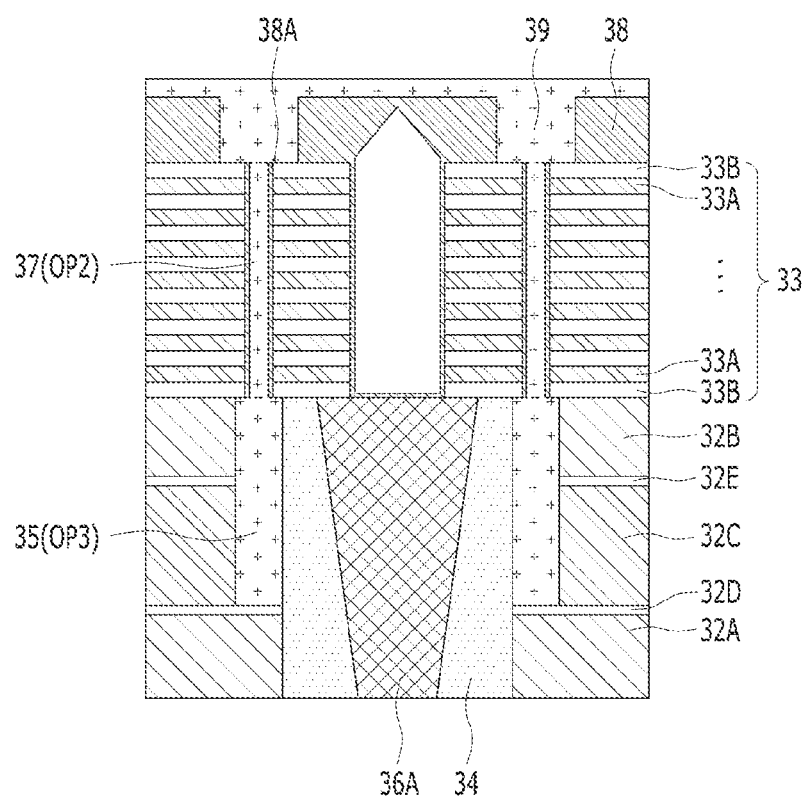
Figure 3L:
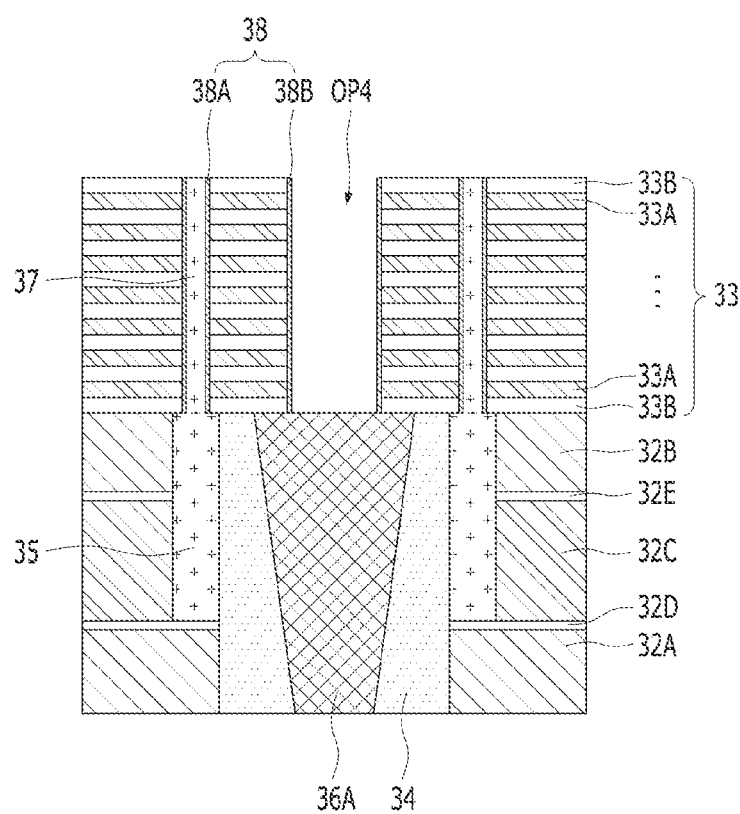
Figure 3M:
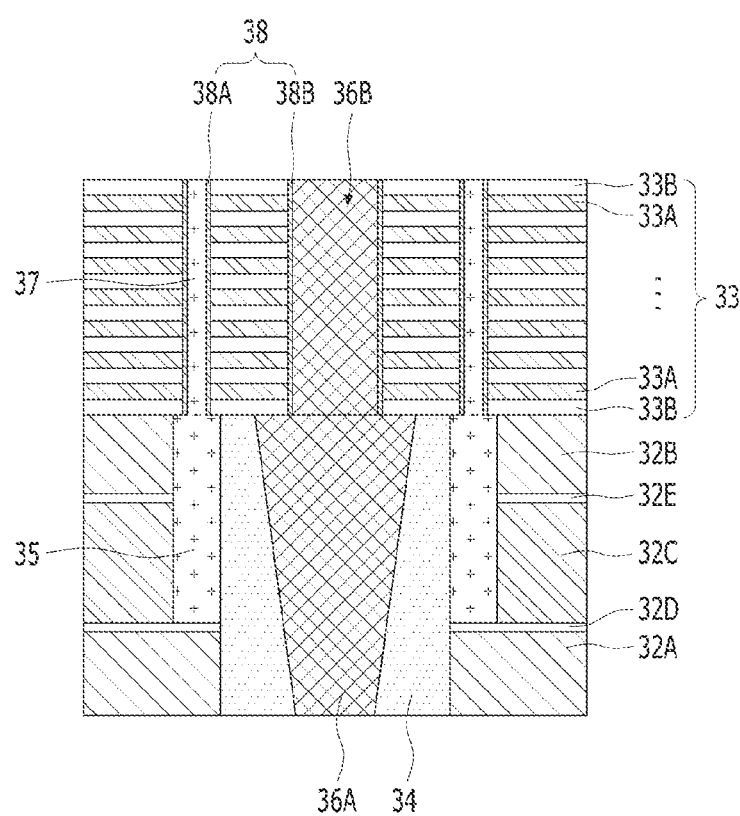
Figure 3N:
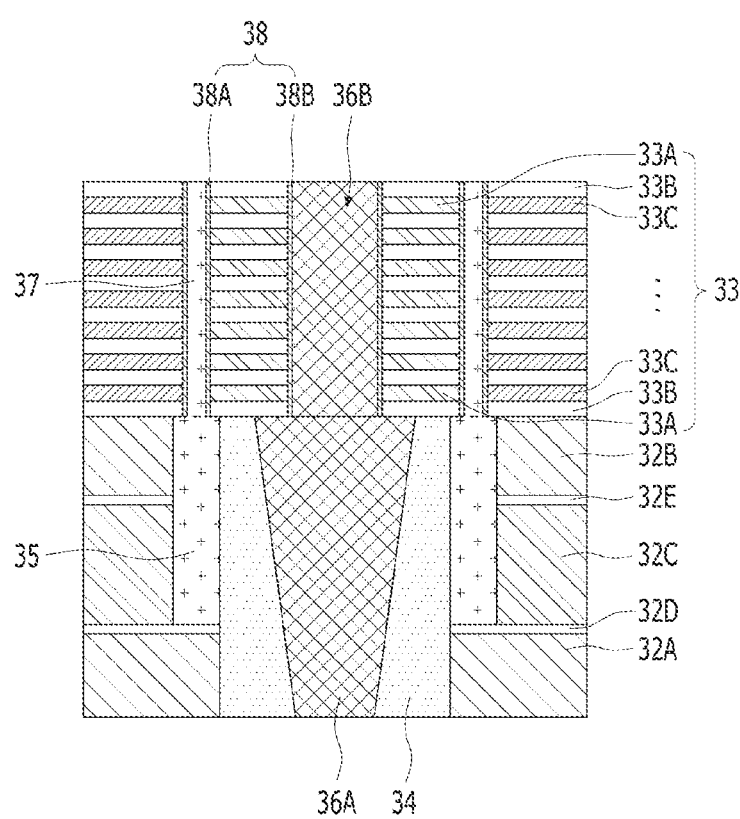

FIG. 3A to FIG. 3N are diagrams illustrating a method for manufacturing a semiconductor device in accordance with an embodiment.

Referring to FIG. 3A, a source structure 32 may be formed. For example, the source structure 32 may be formed by sequentially stacking a first source layer 32A, a first passivation layer 32D, a source sacrificial layer 32C, a second passivation layer 32E, and a second source layer 32B.

Subsequently, a first trench T1 that penetrates the source structure 32 may be formed. The first trench T1 may be used to define a region in which a second spacer (not illustrated) is to be formed. The first trench T1 may penetrate a part of the source structure 32. For example, the first trench T1 may be formed by etching the second source layer 32B, the second passivation layer 32E, and the source sacrificial layer 32C. The first trench T1 may expose the first passivation layer 32D or penetrate the first passivation layer 32D to expose the first source layer 32A.

Referring to FIG. 3B, a sacrificial layer 35A may be formed in the first trench T1. The sacrificial layer 35A may include a material having a high etch selectivity compared to the source structure 32. The sacrificial layer 35A may include a conductive material, such as tungsten or metal.

Referring to FIG. 3C, a first opening OP1 that penetrates the source structure 32 may be formed. For example, the first opening OP1 may be formed by etching the second source layer 32B, the second passivation layer 32E, the source sacrificial layer 32C, the first passivation layer 32D, or the first source layer 32A. When the first opening OP1 is formed, the source sacrificial layer 32C may be partially etched. Upper and lower portions of the first opening OP1 may have a uniform width or different widths. For example, the upper portion may have a larger width than the lower portion.

Referring to FIGS. 3D and 3E, a first spacer 34 may be formed in the first opening OP1. The first spacer 34 may be formed on an inner wall of the first opening OP1 and may have a uniform thickness or may have a different thickness according to regions.

First, referring to FIG. 3D, a first spacer layer 34A may be formed in the first opening OP1. The first spacer layer 34A may be formed through a deposition process and may be formed to fill the first opening OP1. The first spacer layer 34A may include an insulating material, such as oxide.

Subsequently, referring to FIG. 3E, the first spacer layer 34A may be etched to form the first spacer 34. For example, the first spacer 34 may be formed by etching the first spacer layer 34A by using a mask pattern as an etch barrier.

Referring to FIG. 3F, a first contact plug 36A may be formed in the first opening OP1. The shape of the first contact plug 36A may reflect the shape of the first spacer 34. For example, when an inner wall of the first spacer 34 has a vertical profile, a sidewall of the first contact plug 36A may also have a vertical profile. When the inner wall of the first spacer 34 includes an inclined surface, the sidewall of the first contact plug 36A may also include an inclined surface. In such a case, the cross-section of the first contact plug 36A may have a tapered shape. The first contact plug 36A may include a conductive material, such as tungsten or metal. For reference, the first contact plug 36A may be formed through the process of forming the conductive contact plug DCC, described with reference to FIG. 2A.

Referring to FIG. 3G, a stack 33 may be formed on the source structure 32. The stack 33 may include first material layers 33A and second material layers 33B that are alternately stacked. The first material layers 33A may each include a material having a high etch selectivity compared to the second material layers 33B. For example, the first material layers 33A may each include a sacrificial material such as nitride, and the second material layers 33B may each include an insulating material, such as oxide. As another example, the first material layers 33A may each include a conductive material such as polysilicon, tungsten, or molybdenum, and the second material layers 33B may each include an insulating material, such as oxide.

Subsequently, a second opening OP2 that penetrates the stack 33 and exposing the sacrificial layer 35A may be formed. A fourth opening OP4 that penetrates the stack 33 and exposes the first contact plug 36A may be formed. The second opening OP2 and the fourth opening OP4 may be formed at the same time or may be formed through a separate process. The second opening OP2 and the fourth opening OP4 may have substantially the same width or different widths.

Referring to FIG. 3H, a first capping layer 38 may be formed on the stack 33. The first capping layer 38 may be formed on the stack 33 and may seal the second opening OP2 or the fourth opening OP4. The first capping layer 38 may be formed along an inner surface of the second opening OP2 or the fourth opening OP4. On the inner surface of the second opening OP2 or the fourth opening OP4, the first capping layer 38 may be formed to have a thickness so that the second opening OP2 or the fourth opening OP4 is not completely filled. The first capping layer 38 may include an insulating material, such as oxide or nitride.

Referring to FIG. 3I, the second opening OP2 may be selectively opened. For example, the second opening OP2 may be opened by etching the first capping layer 38 by using a mask pattern as an etch barrier. Subsequently, the first capping layer 38 that is formed on the bottom surface of the second opening OP2 may be etched to expose the sacrificial layer 35A. Accordingly, the first capping pattern 38A may remain on an inner wall of the second opening OP2.

Referring to FIG. 3J, a third opening OP3 may be formed by removing the sacrificial layer 35A through the second opening OP2. For example, the third opening OP3 may be formed by selectively etching the sacrificial layer 35A through the second opening OP2. When the sacrificial layer 35A is etched, the stack 33 may be protected by the first capping pattern 38A. In the process of etching the sacrificial layer 35A, the first capping pattern 38A may be partially removed.

Referring to FIG. 3K, a second spacer 35 may be formed in the third opening OP3. The second spacer 35 may be formed to surround a part of a sidewall of the first spacer 34. The second spacer 35 may include an insulating material, such as oxide.

A support 37 may be formed in the second opening OP2. The support 37 may include a material that is substantially equal to or different from that of the second spacer 35. The support 37 may include an insulating material, such as oxide. The first capping pattern 38A that remains in the second opening OP2 may be used as a support.

The second spacer 35 and the support 37 may be formed as separate layers or as a single layer. For example, the second spacer 35 and the support 37 may be formed as a single layer by depositing an insulating material in the second opening OP2 and the third opening OP3. For reference, it is also possible to form the second spacer 25 and the support 37 after the remaining first capping pattern 38A is removed. Furthermore, when the second spacer 35 and the support 37 are formed, a second capping layer 39 may be formed together. The second capping layer 39 may be formed on the stack 33 that is exposed by the first capping layer 38 and may be formed on the first capping layer 38.

Referring to FIG. 3L, the fourth opening OP4 may be opened. For example, the first capping layer 38 and the second capping layer 39 may be etched to open the fourth opening OP4. Subsequently, the first capping layer 38 that is formed on the bottom surface of the fourth opening OP4 may be etched to expose the first contact plug 36A. Accordingly, a second capping pattern 38B may be formed in the fourth opening OP4.

Referring to FIG. 3M, a second contact plug 36B may be formed in the fourth opening OP4. The second contact plug 36B may be formed on the first contact plug 36A and electrically connected to the first contact plug 36A. The second contact plug 36B may include a conductive material, such as tungsten or metal.

Referring to FIG. 3N, the first material layers 33A may be replaced with third material layers 33C. When each of the first material layers 33A includes a sacrificial material and each of the second material layers 33B includes an insulating material, the first material layers 33A may be replaced with conductive layers. For example, a slit (not illustrated) penetrating the stack 33 may be formed, and the first material layers 33A may be removed through the slit. At this time, the first material layers 33A around the slit may be removed, and the first material layers 33A that are protected by the support 37 may remain. Subsequently, conductive layers may be formed in a region from which the first material layers 33A have been removed. The conductive layers may each include a conductive material, such as polysilicon, tungsten, or molybdenum.

Subsequently, although not illustrated in the drawing, the source sacrificial layer 32C, the first passivation layer 32D, and the second passivation layer 32E may be replaced with a third source layer. In such a case, the third source layer may form a source structure together with the first source layer 32A and the second source layer 32B.

According to the manufacturing method as described above, the second spacer 35 may be formed to surround the first spacer 34 so that a sufficient distance between the first contact plug 36A and the source structure 32 can be secured. Accordingly, it is possible to prevent, mitigate, minimize or decrease a bridge from occurring between the first contact plug 36A and the source structure 32.

Furthermore, as the second spacer 35 is formed, an alignment margin between the second contact plug 36B and the first contact plug 36A can be secured. Accordingly, even though the second contact plug 36B is misaligned with the first contact plug 36A when the second contact plug 36B is formed, the second contact plug 36B might not be electrically connected to the source structure 32.

FIG. 4A to FIG. 4E are diagrams illustrating a method for manufacturing a semiconductor device in accordance with an embodiment.

Figure 4A:
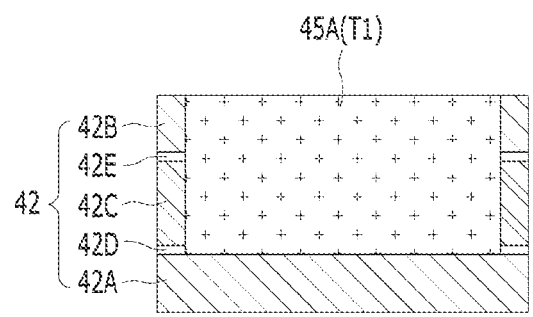
FIG. 4A to FIG. 4E are diagrams illustrating a method for manufacturing a semiconductor device in accordance with an embodiment.

Referring to FIG. 4A, a source structure 42 may be formed. For example, the source structure 42 may be formed by sequentially stacking a first source layer 42A, a first passivation layer 42D, a source sacrificial layer 42C, a second passivation layer 42E, and a second source layer 42B.

Subsequently, a first trench T1 that partially penetrates the source structure 42 may be formed. For example, the first trench T1 may be formed by etching the second source layer 42B, the second passivation layer 42E, and the source sacrificial layer 42C. The first trench T1 may expose the first passivation layer 42D or penetrate the first passivation layer 42D to expose the first source layer 42A.

Subsequently, a second spacer layer 45A may be formed in the first trench T1. The second spacer layer 45A may include a material having a high etch selectivity compared to the source structure 42. The second spacer layer 45A may include an insulating material, such as nitride or oxide.

Figure 4B:
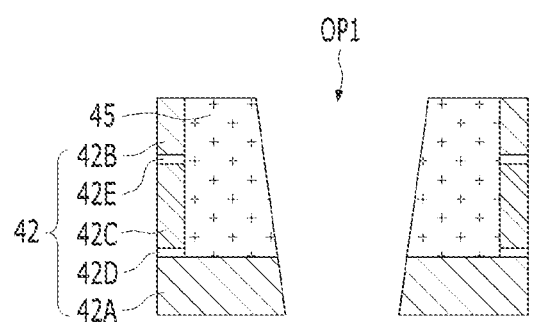

Referring to FIG. 4B, a first opening OP1 that penetrates the second spacer layer 45A and the source structure 42 may be formed. For example, the first opening OP1 may be formed by etching the second spacer layer 45A and the first source layer 42A. The first opening OP1 may be used to define a region in which a first spacer or a first contact plug is to be formed. Upper and lower portions of the first opening OP1 may have a uniform width or different widths. For example, the upper portion may have a larger width than the lower portion.

When the first opening OP1 is formed, a second spacer 45 may be defined. A portion of the second spacer layer 45A, which is not etched and remains, may become the second spacer 45. The shape of an inner wall of the second spacer 45 may reflect the shape of the first opening OP1. When the first opening OP1 has a vertical profile, the inner wall of the second spacer 45 may also be vertical. When the first opening OP1 has a tapered shape, the inner wall of the second spacer 45 may include an inclined surface. The second spacers 45 may have a uniform width or may have different widths according to regions.

Figure 4C:
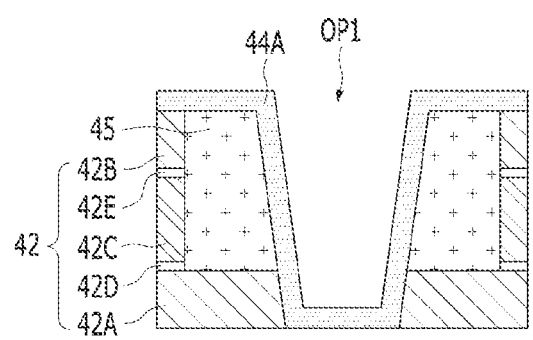

Referring to FIG. 4C, a first spacer layer 44A may be formed in the first opening OP1. The first spacer layer 44A may be conformally formed along an inner surface of the second spacer 45. The first spacer layer 44A may include an insulating material, such as oxide or nitride.

Figure 4D:
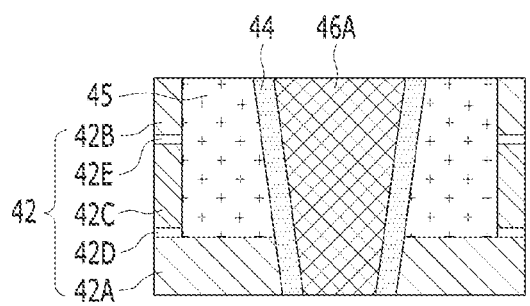

Referring to FIG. 4D, the first spacer layer 44A may be etched to form a first spacer 44. For example, an entire surface of the first spacer layer 44A may be etched to form the first spacer 44. The first spacers 44 may have a uniform width, or may have different widths according to regions. The first spacer 44 may include an inclined inner wall or an inclined outer wall.

Subsequently, a first contact plug 46A may be formed in the first opening OP1. The first contact plug 46A may be formed in the first spacer 44. The first contact plug 46A may include a conductive material, such as tungsten or metal.

Figure 4E:
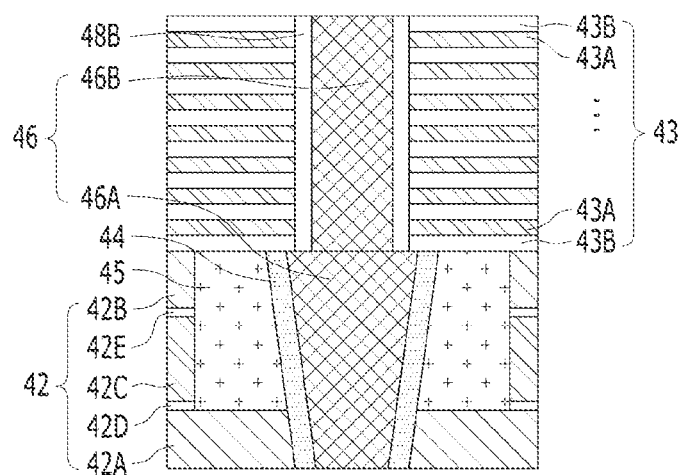

Referring to FIG. 4E, a stack 43 may be formed on the source structure 42. The stack 43 may include first material layers 43A and second material layers 43B that are alternately stacked. The first material layers 43A may each include a material having a high etch selectivity compared to the second material layers 43B. For example, the first material layers 43A may each include a sacrificial material, such as nitride, and the second material layers 43B may each include an insulating material, such as oxide. As another example, each of the first material layers 43A may include a conductive material, such as polysilicon, tungsten, or molybdenum, and each of the second material layers 43B may include an insulating material, such as oxide.

Subsequently, a second contact plug 46B that penetrates the stack 43 and is connected to the first contact plug 46A may be formed. After an opening that penetrates the stack 43 and exposes the first contact plug 46A is formed, a second contact plug 46B may be formed in the opening. Before the second contact plug 46B is formed, an insulating spacer 48B may be formed in the opening. Subsequently, although not illustrated in the drawing, an additional process for forming a support or the like may be performed.

According to the manufacturing method as described above, the thickness of the first spacer 44 may be supplemented by forming the second spacer that surrounds the first spacer 44. The first spacer 44 may be formed without a separate mask pattern. Furthermore, the second spacer layer 45A, other than a sacrificial layer, may be formed in the first trench T1, and the sacrificial layer replacement process, described with reference to FIGS. 3J and 3K, may be omitted.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains without departing from the technical idea of the present disclosure defined in the following claims, and it should be construed that these substitutions, modifications, and changes fall within the scope of the present disclosure.

What is claimed is:

1. A semiconductor device comprising:
a first contact plug penetrating a source structure, the first contact plug having a first portion having a first width and a second portion having a second width that is larger than the first width;
a stack formed on the source structure and the first contact plug;
a second contact plug penetrating the stack, the second contact plug connected to the first contact plug;
a first spacer surrounding the first portion and the second portion of the first contact plug; and
a second spacer surrounding the first spacer to surround the second portion of the first contact plug.

2. The semiconductor device of claim 1, further comprising:
a support penetrating the stack,
wherein the support is connected to the second spacer.

3. The semiconductor device of claim 2, wherein the support includes oxide.

4. The semiconductor device of claim 1, wherein the source structure includes:
a first source layer;
a second source layer; and
a source sacrificial layer located between the first source layer and the second source layer, and
wherein the first spacer penetrates the first source layer, the second source layer, and the source sacrificial layer.

5. The semiconductor device of claim 4, wherein the second spacer penetrates the second source layer and the source sacrificial layer.

6. The semiconductor device of claim 1, wherein the first spacer or the second spacer includes oxide.

7. The semiconductor device of claim 1, wherein the first contact plug or the second contact plug includes tungsten.

8. A semiconductor device comprising:
a first contact plug penetrating a source structure;
a stack formed on the source structure and the first contact plug;
a second contact plug penetrating the stack, the second contact plug connected to the first contact plug;
a first spacer surrounding a sidewall of the first contact plug, the first spacer including a first portion having a first width and a second portion having a second width that is smaller than the first width; and
a second spacer surrounding the second portion of the first spacer.

9. The semiconductor device of claim 8, further comprising:
a support penetrating the stack,
wherein the support is connected to the second spacer.

10. The semiconductor device of claim 9, wherein the support includes oxide.

11. The semiconductor device of claim 8, wherein the source structure includes:
- a first source layer;
- a second source layer; and
- a source sacrificial layer located between the first source layer and the second source layer, and wherein the first spacer penetrates the first source layer, the second source layer, and the source sacrificial layer.

12. The semiconductor device of claim 11, wherein the second spacer penetrates the second source layer and the source sacrificial layer.

13. The semiconductor device of claim 8, wherein the first spacer or the second spacer includes oxide.

14. The semiconductor device of claim 8, wherein the first contact plug or the second contact plug includes tungsten.

* * * * *